United States Patent
Ryu et al.

(10) Patent No.: US 10,410,834 B1
(45) Date of Patent: Sep. 10, 2019

(54) REVERSE POWER REDUCING METHOD AND PLASMA POWER APPARATUS USING THE SAME

(71) Applicant: Newpowerplasma Co., Ltd., Pyoungtak-si, Gyeonggi-do (KR)

(72) Inventors: Seunghee Ryu, Gunpo-si (KR); Youngchul Kim, Osan-si (KR); Minjae Kim, Osan-si (KR)

(73) Assignee: NEWPOWERPLASMA CO., LTD., Pyoungtaek-si, Gyeonggi-do (KR)

( * ) Notice: Subject to any disclaimer, the term of this patent is extended or adjusted under 35 U.S.C. 154(b) by 0 days.

(21) Appl. No.: 16/369,512

(22) Filed: Mar. 29, 2019

(30) Foreign Application Priority Data

Dec. 3, 2018 (KR) .................. 10-2018-0153874

(51) Int. Cl.
*H01J 37/32* (2006.01)
*H03F 3/189* (2006.01)
*H03F 3/20* (2006.01)

(52) U.S. Cl.
CPC .. *H01J 37/32155* (2013.01); *H01J 37/32183* (2013.01); *H03F 3/189* (2013.01); *H03F 3/20* (2013.01); *H03F 2200/387* (2013.01); *H03F 2200/451* (2013.01)

(58) Field of Classification Search
CPC ............... H01J 37/321; H01J 37/32155; H01J 37/32174; H01J 37/32183; H01J 37/32082; H01J 37/32256; H01J 37/32266; H01J 37/32302; H01J 37/3299; H03F 1/56; H03F 3/189; H03F 3/195; H03F 2200/378; H03F 2200/387; H03F 2200/451; H03K 5/00006; H03B 5/1237

See application file for complete search history.

(56) References Cited

U.S. PATENT DOCUMENTS

| | | | |
|---|---|---|---|
| 8,736,377 B2* | 5/2014 | Rughoonundon | H03K 4/026 330/296 |
| 8,773,019 B2* | 7/2014 | Coumou | H03F 1/0211 315/111.21 |
| 8,952,765 B2* | 2/2015 | Fisk, II | H01J 37/32174 332/149 |
| 9,721,758 B2* | 8/2017 | Coumou | H01J 37/32082 |
| 9,876,476 B2* | 1/2018 | Coumou | H03F 1/56 |
| 10,276,351 B1* | 4/2019 | Kim | H02M 3/1582 |
| 2018/0109230 A1 | 4/2018 | Coumou et al. | |

* cited by examiner

*Primary Examiner* — Haissa Philogene
(74) *Attorney, Agent, or Firm* — Rabin & Berdo, P.C.

(57) ABSTRACT

A method for reducing reverse power reflected from a plasma load to a high frequency power amplifier includes determining a sign of a slope of an output frequency outputted from the high frequency power amplifier; determining a sign of a slope of reverse power reflected from the plasma load to the high frequency power amplifier; deciding an increase or a decrease in an amount of frequency change according to a combination of the sign of the slope of the output frequency and the sign of the slope of the reverse power; updating the output frequency by using the amount of the frequency change, and changing the output frequency in order to escape from a hump when a reflection coefficient is larger than a predetermined reflection reference value and the amount of the frequency change is smaller than a predetermined variation width setting value.

8 Claims, 2 Drawing Sheets

REVERSE POWER REDUCING METHOD AND PLASMA POWER APPARATUS USING THE SAME

TECHNICAL FIELD

The present disclosure relates to a plasma power apparatus, and more particularly, to a method for reducing reverse power in a plasma power apparatus.

BACKGROUND ART

Plasma etching is frequently used in a semiconductor manufacturing process. In the plasma etching, ions are accelerated by an electric field in order to etch an exposed surface on a substrate. The electric field is generated according to high frequency signals generated by a high frequency generator of a high frequency power system. The high frequency signals generated by the high frequency generator need to be precisely controlled such that the plasma etching is efficiently performed.

The high frequency power system may include the high frequency generator, an impedance matcher, and a plasma chamber. The high frequency signals are used to drive loads in order to manufacture various components such as integrated circuits (ICs), solar panels, compact disks (CDs), and DVDs.

The high frequency signals are received in the impedance matcher. The impedance matcher matches an input impedance of the impedance matcher to a characteristic impedance of a transmission line between the high frequency generator and the impedance matcher. The impedance matching helps to minimize an amount of power ("forward power") of the impedance matcher applied to a resonant network toward the plasma chamber in a forward direction, and helps to minimize an amount of power ("reverse power") reflected from the impedance matcher to the high frequency generator. When the input impedance of the impedance matcher matches the characteristic impedance of the transmission line, output of the forward power from the high frequency generator to the plasma chamber may be maximized and the reverse power may be minimized.

In supplying the high frequency power, there are two general methods of applying a high frequency signal to a load. First, a traditional method is to apply a continuous wave signal to the load. In the continuous wave mode, the continuous wave signal is generally a sinusoidal wave continuously outputted from a power supply to the load. In the continuous wave method, the high frequency signal is assumed as sinusoidal output, and the amplitude and/or frequency of the sinusoidal wave may be changed in order to change output power applied to the load.

In another method of applying the high frequency signal to the load, a pulse type high frequency signal is used. In the pulse operation mode, a high frequency sinusoidal signal is modulated by a modulation signal in order to define an envelope for a modulated sinusoidal signal. In the related pulse modulation scheme, the high frequency sinusoidal signal is typically outputted at constant frequency and amplitude. Power transmitted to the load does not change the sinusoidal wave or the high frequency signal, but is changed by changing the modulation signal.

In a general high frequency power supply configuration, output power applied to the load is decided using a sensor that measures forward power and reflected power of the high frequency signal applied to the load or measures a voltage and a current. One set of these signals is analyzed in a general feedback loop. Such analysis generally decides a value of power used to adjust the output of the high frequency power supply in order to change power applied to the load. In a high frequency power transmission system in which the load is a plasma chamber, a change in a load impedance causes corresponding variable power applied to the load because applied power is partially a function of the load impedance.

Furthermore, transition from a continuous wave high frequency power transmission system to a pulse high frequency power transmission system presents additional problems. In a typical plasma system, power consumed by plasma depends on the impedance of the plasma. When the impedance is changed to a time scale of a high frequency pulse (for example, a range of 1 kHz to 10 kHz), a sensor and an actuator in an impedance matcher and a high frequency generator need to react with a similar time scale to provide optimal power coupling to the plasma load in order to keep the plasma between pulses. Furthermore, the time response of the impedance is plasma-dependent and changes according to factors such as chemical materials, pressure, and power coupling. Furthermore, various parasitic elements outside the plasma such as resistance loss in a high frequency coupling antenna or a matching system represent power coupling efficiency changing over time during a pulse period, and this is because the parasitic elements are a constantly consumed impedance serially coupled to the impedance load changing over time. Furthermore, since the transmission and reflected power sensors and the high frequency generator are generally corrected for matched terminations, power compensation due to impedance mismatch may contribute to an increase in variability in power transmission.

Furthermore, in order to minimize an influence of impedance transients, it is important to achieve process synchronization between frequency measurement and prediction of a corresponding position of the impedance actuator in the impedance matcher. Furthermore, it becomes more difficult to realize process reproducibility and anti-attributes when achieving a target frequency.

In a current high frequency power generation system, in order to achieve impedance matching between a high frequency generator and a load, a frequency of a high frequency signal may be adjusted within a predetermined range based on a selected target frequency or center frequency. Such frequency-based impedance adjustment is called radio frequency tuning (RFT). In some RFT configurations, the frequency of the high frequency signal may be adjusted toward a predetermined range of limits.

DISCLOSURE

Technical Problem

Accordingly, the present invention has been made keeping in mind the above problems occurring in the related art, and an object of the present invention is to provide a reverse power reducing method capable of quickly tracking a matching frequency of minimum reflected power and a plasma power apparatus using the same.

Furthermore, another object of the present invention is to provide a reverse power reducing method in which it is easy to escape from a hump and a plasma power apparatus using the same.

Technical Solution

In order to accomplish the above objects, there is provided a method for reducing reverse power reflected from a plasma load to a high frequency power amplifier, the method including: an output frequency slope determination step in which a controller determines a sign of a slope of an output frequency outputted from the high frequency power amplifier; a reverse power slope determination step in which the controller determines a sign of a slope of reverse power reflected from the plasma load to the high frequency power amplifier; a frequency change amount increase/decrease decision step in which the controller decides an increase or a decrease in an amount of frequency change according to a combination of the sign of the slope of the output frequency and the sign of the slope of the reverse power; an update step in which the controller updates the output frequency by using the amount of the frequency change; and an output frequency change step in which the controller changes the output frequency in order to escape from a hump when a reflection coefficient is larger than a predetermined reflection reference value and the amount of the frequency change is smaller than a predetermined variation width setting value.

Furthermore, there is provided a plasma power apparatus that reduces reverse power, including a high frequency power amplifier controlled by an amplification control signal and configured to amplify a DC voltage having a predetermined level to generate a high frequency signal having a pulse waveform; an impedance matcher controlled by a matching frequency control signal and configured to match an impedance between the high frequency power amplifier and a plasma load to a predetermined matching frequency; an RF sensor configured to detect forward and reverse electrical signals between the high frequency power amplifier and the impedance matcher and to output an electrical detection signal; and a controller configured to generate the amplification control signal and the matching frequency control signal by using a control signal applied from an exterior and the electrical detection signal outputted from the RF sensor, wherein the controller determines a sign of a slope of an output frequency outputted from the high frequency power amplifier, determines a sign of a slope of reverse power reflected from the plasma load to the high frequency power amplifier, decides an increase or a decrease in an amount of frequency change according to a combination of the sign of the slope of the output frequency and the sign of the slope of the reverse power, updates the output frequency by using the amount of the frequency change, and changes the output frequency in order to escape from a hump when a reflection coefficient is larger than a predetermined reflection reference value and the amount of the frequency change is smaller than a predetermined variation width setting value.

Advantageous Effects

In accordance with the reverse power reducing method and the plasma power apparatus using the same according to the present invention, it is possible to easily track a matching frequency of minimum reflected power and it is easy to escape from a hump.

MODE FOR INVENTION

Hereafter, exemplary embodiments of the present invention will be described with reference to the accompanying drawings. However, the present invention is not intended to be limited to specific embodiments and should be construed to include all modifications, equivalents, and alternatives included in the spirit and scope of the present invention.

Figure 1:
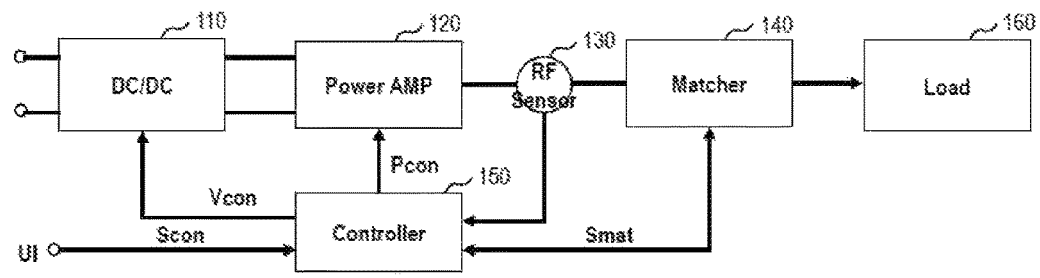
FIG. 1 is an overall block diagram of a plasma power apparatus according to an embodiment of the present invention.

FIG. 1 is an overall block diagram of a plasma power apparatus according to an embodiment of the present invention.

The plasma power apparatus according to the embodiment of the present invention includes a DC/DC converter (DC/DC) 110, a high frequency power amplifier (Power AMP) 120, an RF sensor 130, an impedance matcher (Matcher) 140, a controller 150, and a plasma load (Load) 160.

The DC/DC 110 converts a first DC voltage applied by control of a voltage control signal Vcon outputted from the controller 150 into a second DC voltage. The second DC voltage may be a voltage having various levels.

The Power AMP 120 amplifies the second DC voltage outputted from the DC/DC 110 to generate a high frequency signal having a pulse waveform. According to the present invention, instead of measuring an output frequency of the Power AMP 120, the output frequency may be changed by controlling an electrical signal through an internal direct digital synthesizer (DDS, not illustrated).

The RF sensor 130 is disposed between the Power AMP 120 and the Matcher 140, detects forward and reverse electrical signals, and outputs an electrical detection signal. The electrical detection signal may be at least one of a detected current value Is, a detected voltage value Vs, forward power Pfwd supplied from the Power AMP 120 to the Load 160 (a plasma chamber), and reverse power Prev reflected from the Load 160 to the Power AMP 120.

The Matcher 140 is coupled between the Power AMP 120 and the Load 160, and is controlled by a matching frequency control signal Smat outputted from the controller 150 to match an impedance between the Power AMP 120 and the Load 160 to a predetermined matching frequency.

The controller 150 may output a voltage control signal Vcon and an amplification control signal Pcon by executing a forward power control algorithm by using a control signal Scon applied from an exterior and the electrical detection signal outputted from the RF sensor 130, and generate the matching frequency control signal Smat by executing a frequency variable impedance matching algorithm.

Figure 2:
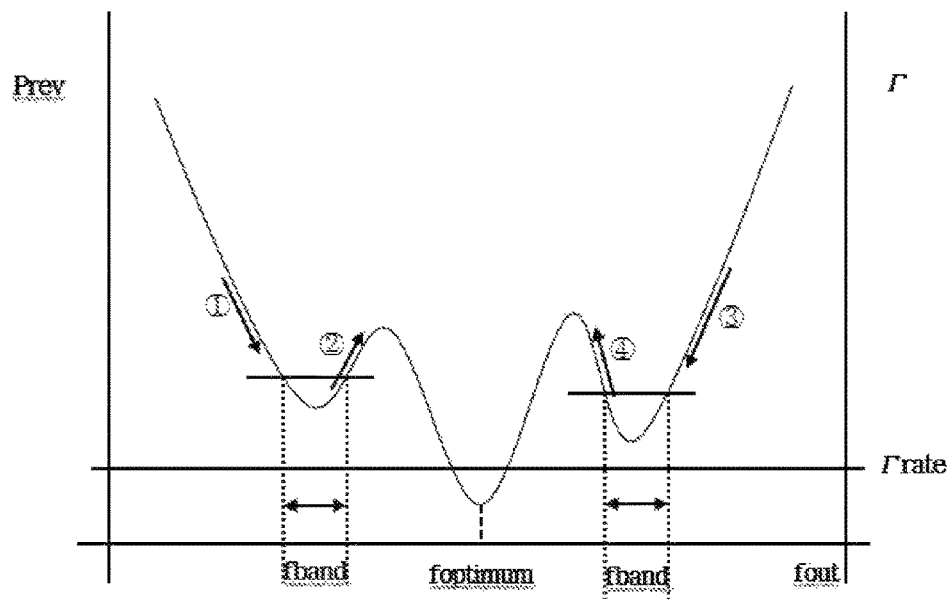
FIG. 2 is a graph illustrating radio frequency tuning according to an embodiment of the present invention.

FIG. 2 is a graph illustrating auto output frequency tuning according to an embodiment of the present invention.

Referring to the graph illustrating the auto output frequency tuning according to the embodiment of the present invention, the reverse power $P_{rev}$ decreases until an output frequency $f_{out}$ of the Power AMP 120 reaches an optimum frequency $f_{optimum}$. However, as illustrated in FIG. 2, the reverse power $P_{rev}$ may increase and then decrease in a predetermined section of the output frequency according to a load, and the optimum frequency $f_{optimum}$ may be reached beyond a hump.

For example, when starting from a section ① in which the reverse power $P_{rev}$ decreases as the output frequency $f_{out}$ increases, the optimum frequency $f_{optimum}$ may be reached beyond a section ② in which the reverse power $P_{rev}$ increases as the output frequency $f_{out}$ increases.

Alternatively, when starting from a section ③ in which the reverse power $P_{rev}$ decreases as the output frequency $f_{out}$ decreases, the optimum frequency $f_{optimum}$ may be reached beyond a section ④ in which the reverse power $P_{rev}$ increases as the output frequency $f_{out}$ decreases.

Figure 3:
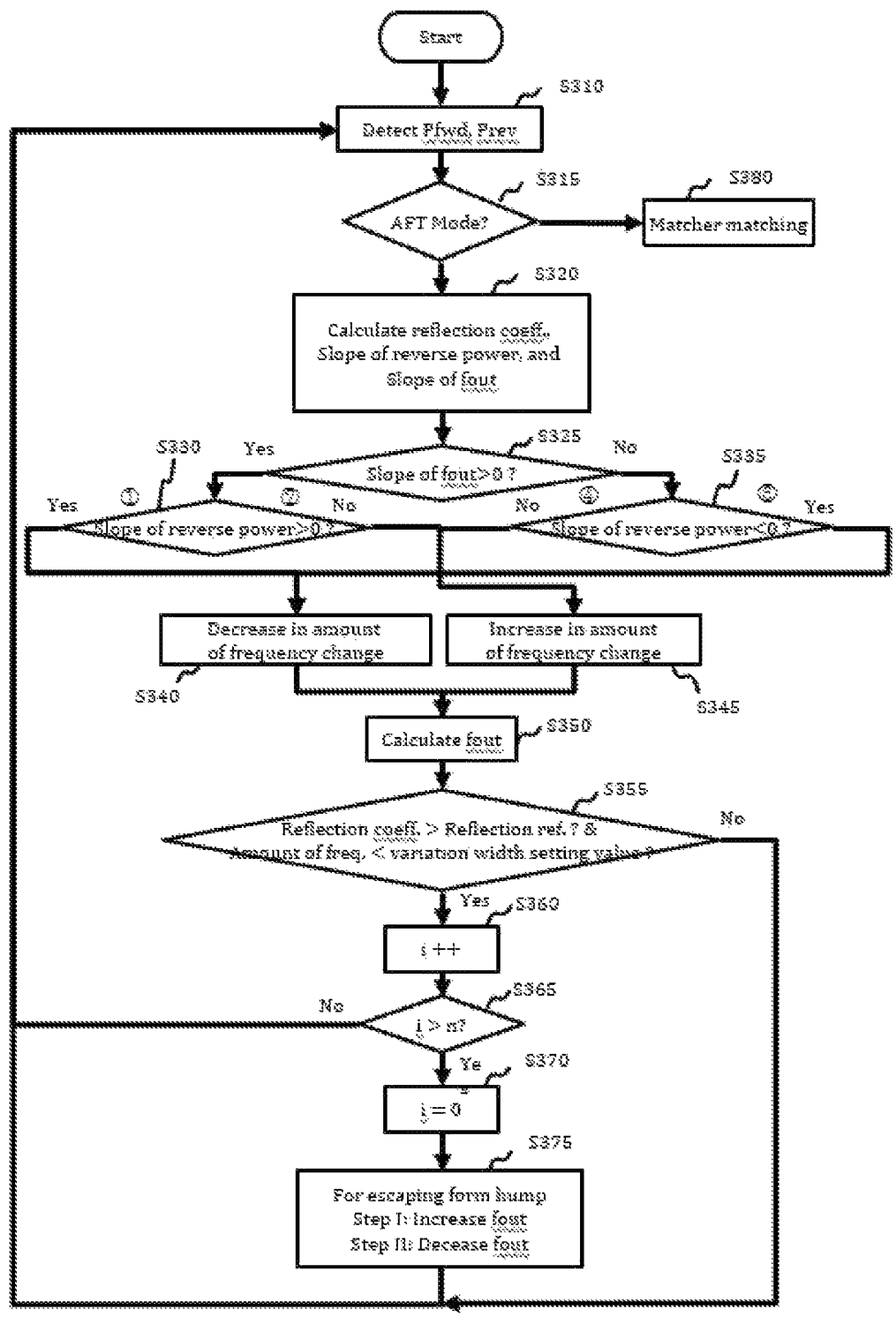
FIG. 3 is a flowchart illustrating the radio frequency tuning according to an embodiment of the present invention.

As an embodiment of the hump escape as described above, FIG. 3 is a flowchart illustrating the auto output frequency tuning according to an embodiment of the present invention, and an auto output frequency tuning method according to an embodiment of the present invention is as follows.

The controller may decide a sign of an amount of frequency change to be negative when a product of a sign of the slope of the output frequency and a sign of the slope of the reverse power is positive, and decide the sign of the amount of the frequency change to be positive when the product of the sign of the slope of the output frequency and the sign of the slope of the reverse power is negative.

Furthermore, the amount of the frequency change may be decided by a reflection coefficient and the slope of the reverse power.

The controller 150 measures the forward power Pfwd supplied from the Power AMP 120 to the Load 160, and the reverse power Prev reflected from the Load 160 to the Power AMP 120 (S310).

The controller 150 determines whether the Power AMP 120 is currently performing an auto frequency tune (AFT) mode (S315).

When the Power AMP 120 is currently performing the auto frequency tune mode, the controller 150 calculates the reflection coefficient by using the forward power and the reverse power, calculates the slope of the reverse power by using the current reverse power and immediately previous reverse power, and calculates the slope of the output frequency by using the current output frequency and an immediately previous output frequency (S320).

The controller 150 determines a sign of the slope of the output frequency (S325) and determines a sign of the slope of the reverse power (S330 and S335).

① when the Reverse Power Decreases as the Output Frequency Increases

When the sign of the slope of the output frequency is positive and the sign of the slope of the reverse power is negative, the controller 150 calculates a decrement of the amount of the frequency change, which is proportional to the slope of the reverse power and/or the reflection coefficient (S340).

② when the Reverse Power Increases as the Output Frequency Increases

When the sign of the slope of the output frequency is positive and the sign of the slope of the reverse power is positive, the controller 150 calculates an increment of the amount of the frequency change, which is proportional to the slope of the reverse power and/or the reflection coefficient (S345).

③ when the Reverse Power Decreases as the Output Frequency Decreases

When the sign of the slope of the output frequency is negative and the sign of the slope of the reverse power is negative, the controller 150 calculates an increment of the amount of the frequency change, which is proportional to the slope of the reverse power and/or the reflection coefficient (S340).

④ when the Reverse Power Increases as the Output Frequency Decreases

When the sign of the slope of the output frequency is negative and the sign of the slope of the reverse power is positive, the controller 150 calculates a decrement of the amount of the frequency change, which is proportional to the slope of the reverse power and/or the reflection coefficient (S345).

According to another embodiment of the present invention, the controller 150 may calculate the amount of the frequency change by multiplying the reflection coefficient by a predetermined value (for example, 2 or 3) or by using a square root or a cube root of the reflection coefficient, instead of the reflection coefficient. Accordingly, the frequency change may be further accelerated.

The controller 150 may update the output frequency by using the calculated amount of the frequency change (S350).

After updating the output frequency, the controller 150 determines whether the reflection coefficient is larger than a reflection reference value and the amount of the frequency change is smaller than a variation width setting value (S355). The variation width setting value is a frequency band having an arbitrary size determined to escape from the hump. When the amount of the frequency change is larger than the variation width setting value, it is possible to escape from the hump.

When the reflection coefficient is larger than the reflection reference value and the amount of the frequency change is smaller than the variation width setting value, the controller 150 returns to step S310 and repeats step S310, step S315, step S320, step S325, step S330, step S335, step S340, step S345, step S350, and step S355 n times (n is a natural number) (S360).

The controller 150 determines whether the number of times of repeating step S310, step S315, step S320, step S325, step S330, step S335, step S340, step S345, step S350, and step S355 has reached a predetermined number of times (S365). When the number of times of repeating step S310 and repeats step S310, step S315, step S320, step S325, step S330, step S335, step S340, step S345, step S350, and step S355 exceeds the predetermined number of times, the controller 150 resets the count (S370) and alternately increases/decreases the output frequency to calculate an output frequency for escaping from the hump (S375). That is, the controller 150 alternately performs Step I of attempting to escape from the hump by increasing the output frequency and Step II of attempting to escape from the hump by decreasing the output frequency.

Furthermore, when it is determined in S315 that the Power AMP 120 has ended the auto frequency tune (AFT) mode, the controller 150 outputs the matching frequency control signal Smat so that the Matcher 140 performs impedance matching (S380).

Various modifications can be made in the invention disclosed above within the scope not impairing the basic scope. That is, all the above embodiments should be construed to be illustrative and is not construed to be limitative. Accordingly, the protection scope of the present invention should be defined according to the accompanying claims rather than the above embodiments, and when elements defined in the accompanying claims are replaced with equivalents thereof, this is intended to fall within the scope of the present invention.

DESCRIPTION OF REFERENCE NUMERALS OF IMPORTANT PARTS

110: DC/DC converter (DC/DC)
120: high frequency power amplifier (Power AMP)
130: RF sensor
140: impedance matcher (Matcher)

150: controller
160: plasma load (Load)

What is claimed is:

1. A method for reducing reverse power reflected from a plasma load to a high frequency power amplifier, the method comprising:
   an output frequency slope determination step in which a controller determines a sign of a slope of an output frequency outputted from the high frequency power amplifier;
   a reverse power slope determination step in which the controller determines a sign of a slope of reverse power reflected from the plasma load to the high frequency power amplifier;
   a frequency change amount increase/decrease decision step in which the controller decides an increase or a decrease in an amount of frequency change according to a combination of the sign of the slope of the output frequency and the sign of the slope of the reverse power;
   an update step in which the controller updates the output frequency by using the amount of the frequency change; and
   an output frequency change step in which the controller changes the output frequency in order to escape from a hump when a reflection coefficient is larger than a predetermined reflection reference value and the amount of the frequency change is smaller than a predetermined variation width setting value.

2. The method of claim 1, wherein the controller decreases the amount of the frequency change when a product of the sign of the slope of the output frequency and the sign of the slope of the reverse power is positive, and increases the amount of the frequency change when the product of the sign of the slope of the output frequency and the sign of the slope of the reverse power is negative.

3. The method of claim 2, wherein the increase or the decrease in the amount of the frequency change is decided by the reflection coefficient and/or the slope of the reverse power.

4. The method of claim 1, wherein, in the output frequency change step, the controller alternately performs:
   a step of attempting to escape from the hump by increasing the output frequency; and
   a step of attempting to escape from the hump by decreasing the output frequency.

5. A plasma power apparatus that reduces reverse power, comprising:
   a high frequency power amplifier controlled by an amplification control signal and configured to amplify a DC voltage having a predetermined level to generate a high frequency signal having a pulse waveform;
   an impedance matcher controlled by a matching frequency control signal and configured to match an impedance between the high frequency power amplifier and a plasma load to a predetermined matching frequency;
   an RF sensor configured to detect forward and reverse electrical signals between the high frequency power amplifier and the impedance matcher and to output an electrical detection signal; and
   a controller configured to generate the amplification control signal and the matching frequency control signal by using a control signal applied from an exterior and the electrical detection signal outputted from the RF sensor,
   wherein the controller determines a sign of a slope of an output frequency outputted from the high frequency power amplifier, determines a sign of a slope of reverse power reflected from the plasma load to the high frequency power amplifier, decides an increase or a decrease in an amount of frequency change according to a combination of the sign of the slope of the output frequency and the sign of the slope of the reverse power, updates the output frequency by using the amount of the frequency change, and changes the output frequency in order to escape from a hump when a reflection coefficient is larger than a predetermined reflection reference value and the amount of the frequency change is smaller than a predetermined variation width setting value.

6. The plasma power apparatus of claim 5, wherein the controller decreases the amount of the frequency change when a product of the sign of the slope of the output frequency and the sign of the slope of the reverse power is positive, and increases the amount of the frequency change when the product of the sign of the slope of the output frequency and the sign of the slope of the reverse power is negative.

7. The plasma power apparatus of claim 5, wherein the increase or the decrease in the amount of the frequency change is decided by the reflection coefficient and/or the slope of the reverse power.

8. The plasma power apparatus of claim 5, wherein, in changing the output frequency, the controller alternately performs:
   a step of attempting to escape from the hump by increasing the output frequency; and
   a step of attempting to escape from the hump by decreasing the output frequency.

* * * * *